(12) United States Patent
Inai

(10) Patent No.: US 10,171,718 B2
(45) Date of Patent: Jan. 1, 2019

(54) CAPACITIVE ROTATION SENSING APPARATUS AND METHOD

(71) Applicant: CANON KABUSHIKI KAISHA, Tokyo (JP)

(72) Inventor: Kento Inai, Zushi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 390 days.

(21) Appl. No.: 14/852,344

(22) Filed: Sep. 11, 2015

(65) Prior Publication Data

US 2016/0077630 A1 Mar. 17, 2016

(30) Foreign Application Priority Data

Sep. 12, 2014 (JP) ................. 2014-186902

(51) Int. Cl.
*H04N 5/232* (2006.01)
*G06F 3/0362* (2013.01)
(Continued)

(52) U.S. Cl.
CPC ............ *H04N 5/232* (2013.01); *G03B 17/02* (2013.01); *G06F 3/0362* (2013.01);
(Continued)

(58) Field of Classification Search
CPC ........ G01D 5/24; G01D 5/241; G01D 5/2412; G01D 5/2415; G01D 5/24452;
(Continued)

(56) References Cited

U.S. PATENT DOCUMENTS 6,229,301 B1 * 5/2001 Bolli ................. G01B 3/205
324/207.21
8,040,142 B1 * 10/2011 Bokma ............... H03K 17/955
324/658
(Continued)

FOREIGN PATENT DOCUMENTS

CN 101055507 A 10/2007
CN 102681692 A 9/2012
(Continued)

*Primary Examiner* — Jeff Natalini
*Assistant Examiner* — Steven Yeninas
(74) *Attorney, Agent, or Firm* — Canon U.S.A., Inc. IP Division

(57) ABSTRACT

An electronic apparatus includes a first detection electrode group, a second detection electrode group, a third detection electrode group, a rotating member for moving among positions in which the rotating member faces the first to third detection electrode groups, a detection unit for detecting electrostatic capacitances of the first to third detection electrode groups, a determination unit for determining a rotation direction, a rotation amount, or a rotation angle of the rotating member in accordance with the electrostatic capacitances of the first to third detection electrode groups and threshold values for the first to third detection electrode groups, and an updating unit for updating a reference value of one of the first to third detection electrode groups corresponding to a selected smallest electrostatic capacitance using the selected smallest electrostatic capacitance.

11 Claims, 8 Drawing Sheets

(51) Int. Cl.
*G03B 17/02* (2006.01)
*G01R 27/26* (2006.01)
*H04N 5/225* (2006.01)

(52) U.S. Cl.
CPC ........ *G01R 27/2605* (2013.01); *H04N 5/2251* (2013.01); *H04N 5/23293* (2013.01)

(58) Field of Classification Search
CPC .. G01D 18/004; G01D 18/006; G01D 18/008; G06F 3/0362; G01R 27/2605; G01P 3/483; G03B 17/02; H04N 5/2251; H04N 5/232; H04N 5/23293
USPC .......... 324/207.25, 658, 660, 679, 687, 688; 345/184; 702/65, 87, 94, 95
See application file for complete search history.

(56) References Cited

U.S. PATENT DOCUMENTS

| | | | |
|---|---|---|---|
| 2007/0242053 A1 | 10/2007 | Muranaka | |
| 2012/0229150 A1 | 9/2012 | Inai | |
| 2013/0002706 A1 | 1/2013 | Rezende | |
| 2013/0027062 A1* | 1/2013 | Inai | ........................ G06F 3/044 |
| | | | 324/679 |

FOREIGN PATENT DOCUMENTS

| | | |
|---|---|---|
| JP | 2001-296966 A | 10/2001 |
| JP | 2010-287351 A | 12/2010 |
| JP | 2013-030120 A | 2/2013 |
| JP | 2013-030121 A | 2/2013 |
| JP | 2014-119931 A | 6/2014 |

* cited by examiner

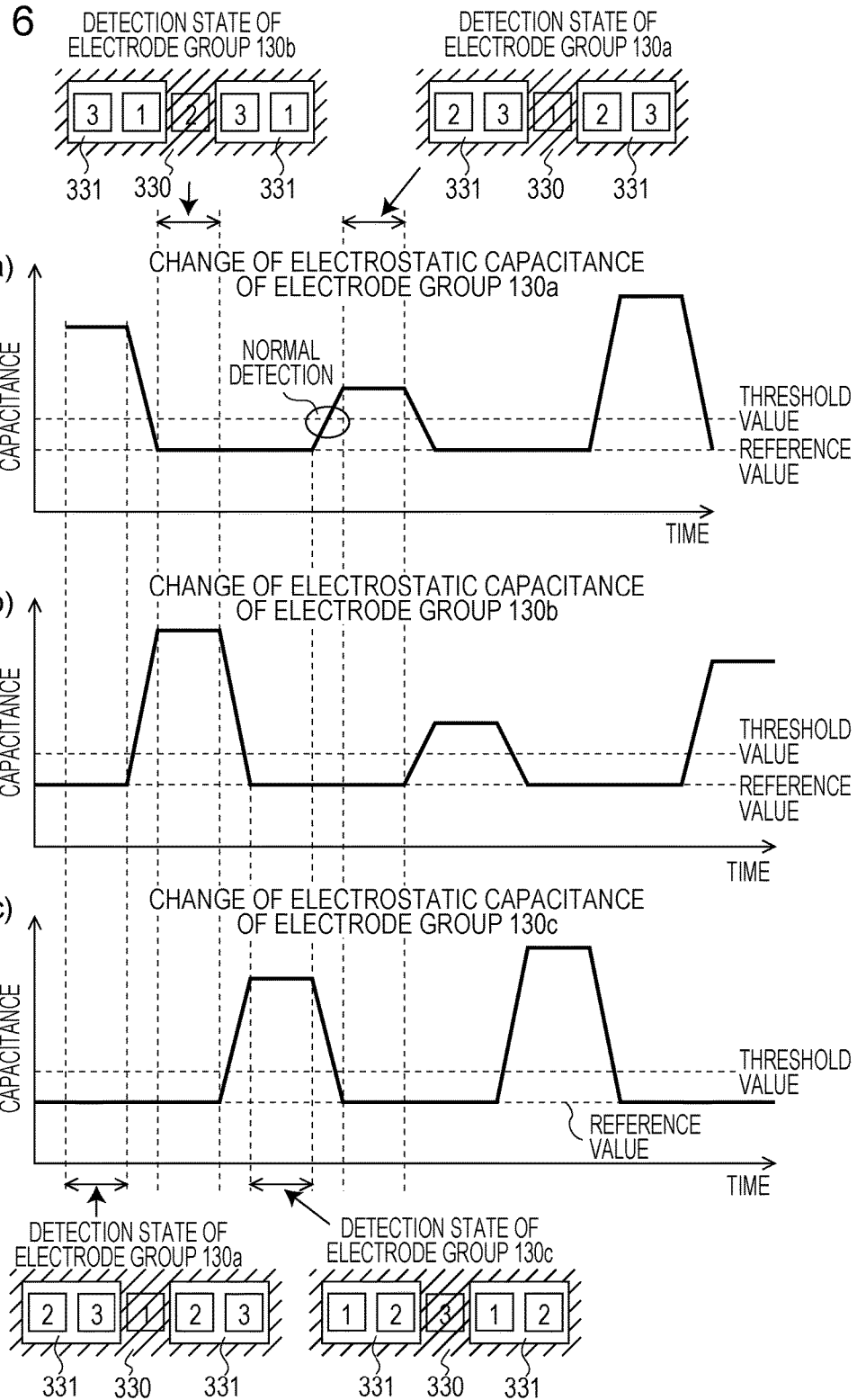

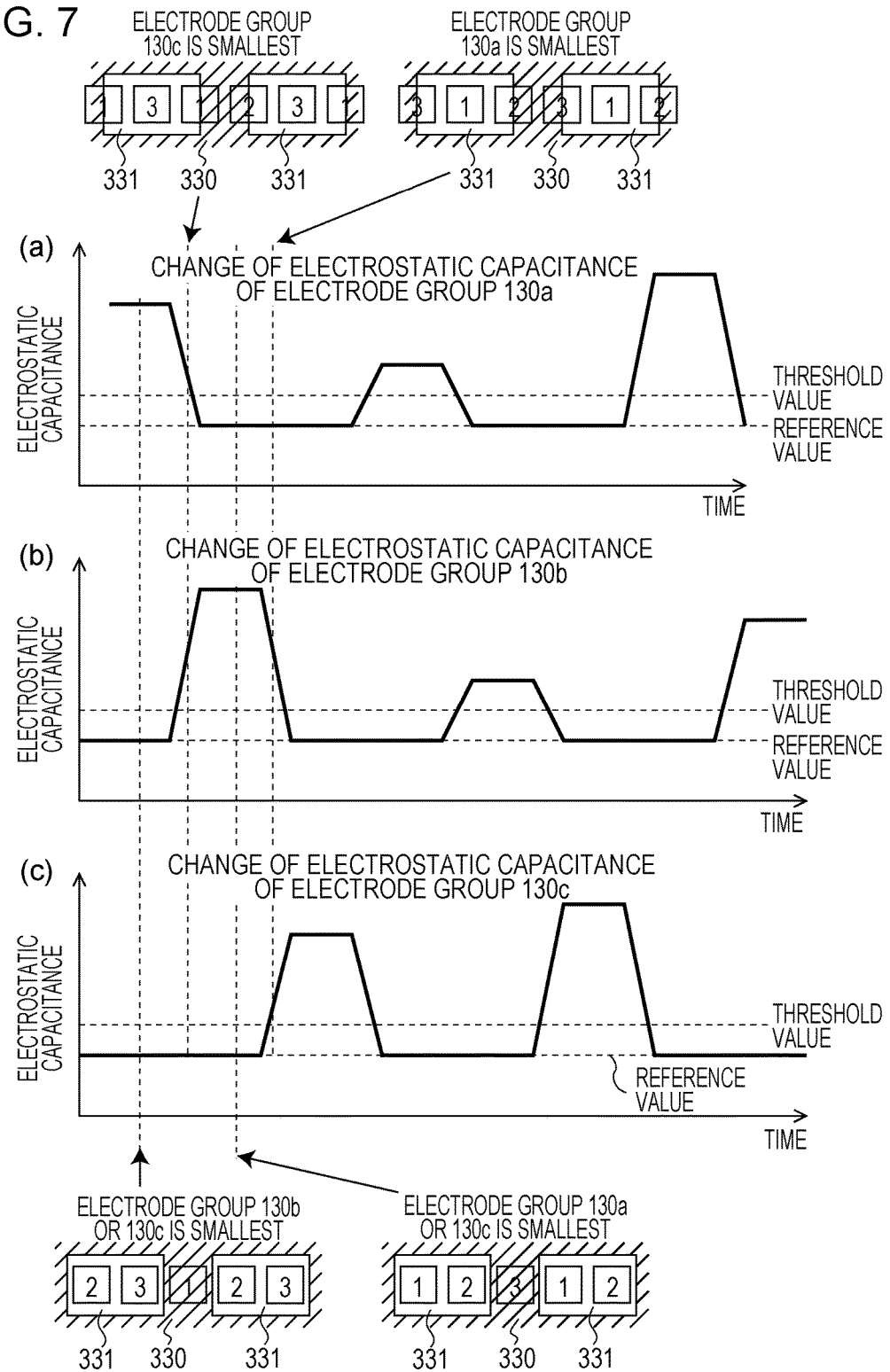

CAPACITIVE ROTATION SENSING APPARATUS AND METHOD

BACKGROUND

Field of the Invention

The present invention relates to an electronic apparatus including an operation member employing an electrostatic capacitance detection method, and a control method thereof.

Description of the Related Art

In recent years, touch panels for detecting a touch operation performed by a user are implemented in various apparatuses as a detection device. Among such touch panels, a touch panel employing an electrostatic capacitance detection method for performing simultaneous multipoint detection with ease has been widely used.

Japanese Patent Laid-Open No. 2013-30121 discloses a detection apparatus employing the electrostatic capacitance detection method. In the detection apparatus disclosed in Japanese Patent Laid-Open No. 2013-30121, a movement direction of an operation point may be detected by detecting increase or decrease of electrostatic capacitances in detection electrodes.

Such a detection apparatus employing the electrostatic capacitance detection method has problems in rattle of components, and changes of an electrostatic capacitance between detection electrodes caused by time-related deterioration. To address these problems, a technique of absorbing changes of electrostatic capacitances by controlling a gain is proposed in Japanese Patent Laid-Open No. 2010-287351.

However, in the technique disclosed in Japanese Patent Laid-Open No. 2010-287351, a rotation phase is calculated using a ratio of electrostatic capacitances of electrodes to each other. Therefore, when rattle of components is detected during an operation, an appropriate electrostatic capacitance ratio may not be detected, and accordingly, a rotation direction, a rotation amount, or a rotation angle may not be appropriately detected.

SUMMARY

According to an aspect of the present invention, an electronic apparatus capable of detecting a rotation direction, a rotation amount, or a rotation angle, and a method for detecting a rotation direction, a rotation amount, or a rotation angle are provided.

According to an aspect of the present invention, an electronic apparatus capable of detecting an operation direction or an operation amount, and a method for detecting an operation direction or an operation amount are provided.

According to an aspect of the present invention, there is provided an electronic apparatus including a first detection electrode group, a second detection electrode group including electrodes which are arranged adjacent to electrodes included in the first detection electrode group, a third detection electrode group including electrodes which are arranged adjacent to the electrodes included in the second detection electrode group, a rotating member configured to move among positions in which the rotating member faces the first to third detection electrode groups, a detection unit that detects electrostatic capacitances of the first to third detection electrode groups, a determination unit that determines a rotation direction, a rotation amount, or a rotation angle of the rotating member in accordance with the electrostatic capacitances of the first to third detection electrode groups and threshold values for the first to third detection electrode groups, a selecting unit that selects a smallest one of the electrostatic capacitances of the first to third detection electrode groups, and an updating unit that updates a reference value of one of the first to third detection electrode groups corresponding to the selected smallest one of the electrostatic capacitances using the selected smallest one of the electrostatic capacitances.

According to an aspect of the present invention, there is provided a method including detecting electrostatic capacitances of first to third detection electrode groups, determining a rotation direction, a rotation amount, or a rotation angle of a rotating member in accordance with the electrostatic capacitances of the first to third detection electrode groups and threshold values for the first to third detection electrode groups, selecting a smallest one of the electrostatic capacitances of the first to third detection electrode groups, and updating a reference value of one of the first to third detection electrode groups corresponding to the selected smallest one of the electrostatic capacitances using the selected smallest one of the electrostatic capacitances. The second detection electrode group includes electrodes which are arranged adjacent to electrodes included in the first detection electrode group. The third detection electrode group includes electrodes which are arranged adjacent to the electrodes included in the second detection electrode group. The rotating member is configured to move among positions in which the rotating member faces the first to third detection electrode groups.

Further features and aspects of the present invention will become apparent from the following description of exemplary embodiments.

BRIEF DESCRIPTION OF THE DRAWINGS

The drawings, which are incorporated in and constitute a part of the specification, illustrate exemplary embodiments, features, and aspects of the present invention.

FIG. 6 is a diagram illustrating changes of electrostatic capacitances of detection electrode groups.

FIG. 7 is a diagram illustrating the reference value updating process.

DESCRIPTION OF THE EMBODIMENTS

Exemplary embodiments, features, and aspects of the present invention will be described below with reference to the drawings.

First Embodiment

Figure 1:
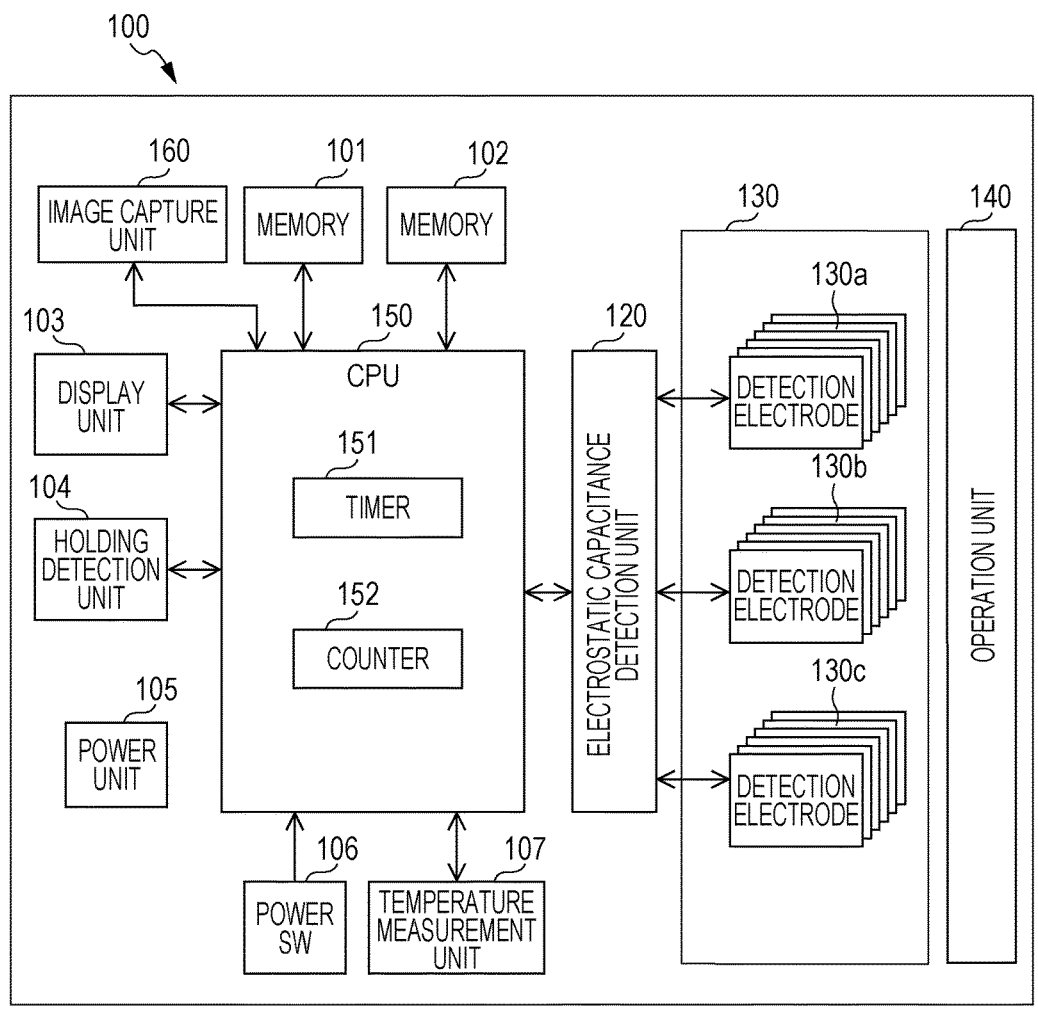
FIG. 1 is a block diagram illustrating components included in an electronic apparatus 100 according to a first embodiment.
Figure 2A:
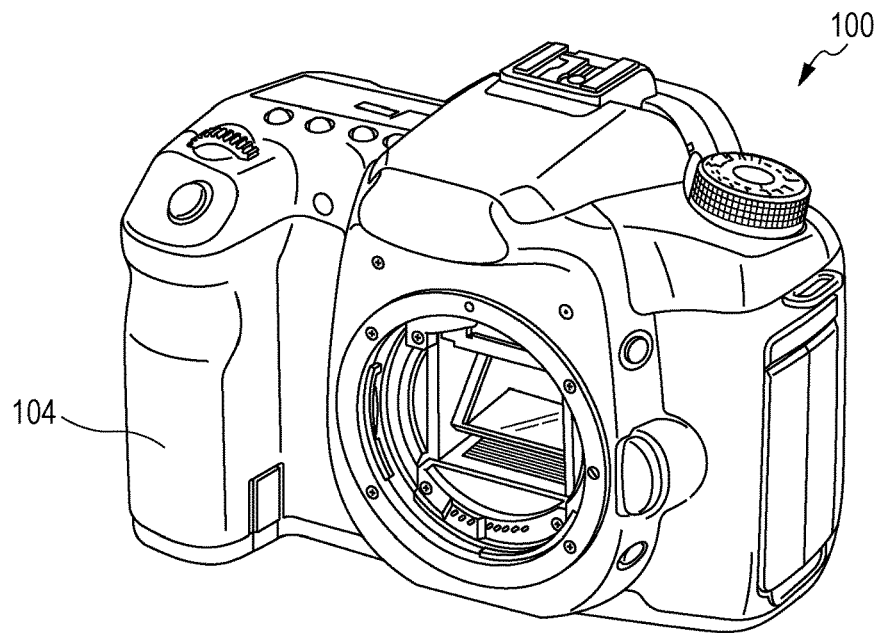
FIGS. 2A and 2B are diagrams illustrating appearance of the electronic apparatus 100 according to the first embodiment.
Figure 2B:
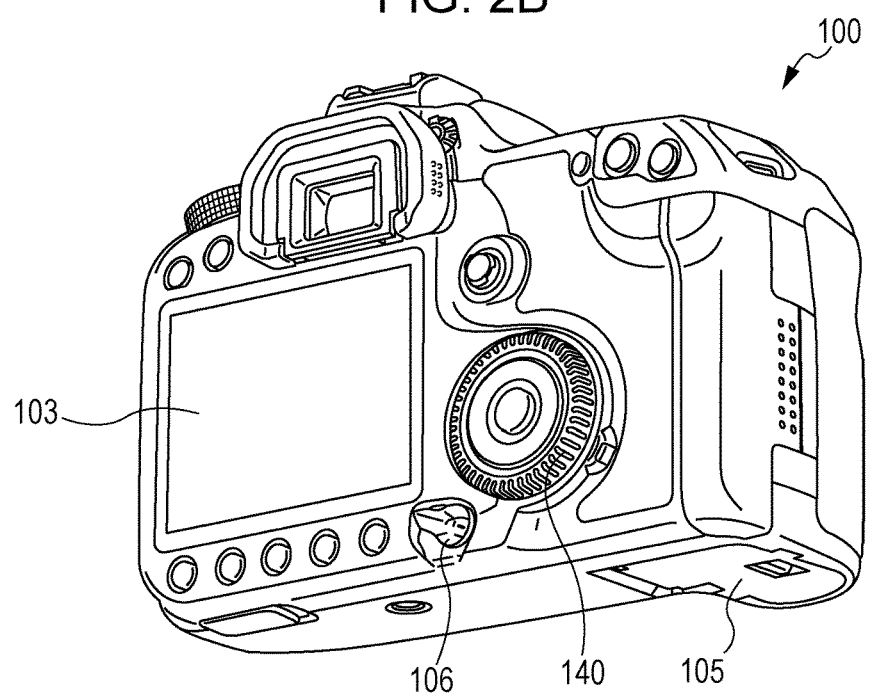

FIG. 1 is a block diagram illustrating components included in an electronic apparatus 100 according to a first embodiment. FIGS. 2A and 2B are diagrams illustrating appearance of the electronic apparatus 100 according to the first embodiment. The electronic apparatus 100 according to the first embodiment is an image capture apparatus, for example. The image capture apparatus is capable of operating as a camera. Examples of the image capture apparatus include a digital camera, and a mobile phone with a camera. At least one of components included in the electronic apparatus 100 is implemented as a hardware configuration in the electronic apparatus 100.

The electronic apparatus 100 includes a first memory 101 which is a nonvolatile memory, for example. A central processing unit (CPU) 150 may access the first memory 101 which stores programs to be executed by the CPU 150. Furthermore, at least one reference value and at least one threshold value (predetermined value) to be used in an electrostatic capacitance detection unit 120 are stored in the first memory 101. Although the first memory 101 is constituted by a flash memory, for example, in the first embodiment, other memory devices may be used.

A second memory 102 is a random access memory (RAM), for example. The CPU 150 may access the second memory 102 which functions as a work memory of the CPU 150. Image data (including a still image or a moving image) generated by an image capture unit 160 included in the electronic apparatus 100 is also stored in the second memory 102. Image data which has been subjected to an image process performed by the CPU 150 is also stored in the second memory 102.

A display unit 103 operates as a display device capable of displaying still images, moving images, a menu, and the like. The display unit 103 is also used as a view finder for displaying a live view image captured by the image capture unit 160. The still images, the moving images, the menu, and the like displayed in the display unit 103 are supplied from the CPU 150.

A holding detection unit 104 may detect that a user holds the electronic apparatus 100 and notify the CPU 150 of a result of the detection. According to FIG. 2A, the holding detection unit 104 is disposed in a grip portion of the electronic apparatus 100. However, the arrangement position is not limited to this, and the holding detection unit 104 may be disposed in an arbitrary position of the electronic apparatus 100. The electronic apparatus 100 may include holding detection units 104. The holding detection unit 104 is constituted by a sensor integrated circuit (ICs), such as an electrostatic capacitance sensor or a photo interrupter.

A power unit 105 may be connected to a battery and an AC adapter, and supplies power to the components included in the electronic apparatus 100 through a DC-DC converter or the like. The battery and the AC adapter are detachable from the power unit 105.

A power switch (power SW) 106 is used to perform power-on or power-off of the power unit 105 of the electronic apparatus 100. The power SW 106 is connected to the CPU 150. In FIG. 2B, a case where the power SW 106 is a mechanical switch having an on-position and an off-position. However, the power SW 106 may be a push switch, an electric switch, or the like. When the power SW 106 is in an off state, the electronic apparatus 100 is in a low power consumption state or a power off state even when the battery or the AC adapter is connected to the power unit 105. When the power SW 106 becomes an on state in a state in which the battery or the AC adapter is connected to the power unit 105, power is supplied to the components included in the electronic apparatus 100. As a result, the electronic apparatus 100 enters a normal state or a power-on state and is ready to perform a normal operation. Note that an operation unit 140 may be operated both in a power-on state and a power-off state of the power SW 106.

A temperature measurement unit 107 measures an ambient temperature of the electrostatic capacitance detection unit 120 and notifies the CPU 150 of a result of the measurement. The temperature measurement unit 107 is constituted by a temperature sensor IC, for example.

The CPU 150 includes a microprocessor which integrally controls the components of the electronic apparatus 100. The microprocessor included in the CPU 150 has a hardware configuration. The CPU 150 may control the components included in the electronic apparatus 100 so that the electronic apparatus 100 operates as the image capture apparatus. Although described in detail later, the CPU 150 is capable of switching an operation mode of the electronic apparatus 100 in accordance with a result of a detection of an operation performed on the operation unit 140 and updating display in the display unit 103.

A timer 151 continuously operates and causes an interrupt to the CPU 150 at a predetermined interval. Although the timer 151 is incorporated in the CPU 150 in FIG. 1, the timer 151 may be disposed outside the CPU 150.

A counter 152 counts the number of times the operation unit 140 is operated and notifies the CPU 150 of a count value. Although the counter 152 is incorporated in the CPU 150 in FIG. 1, the counter 152 may be disposed outside the CPU 150. The counter 152 may count the number of times an operation unit different from the operation unit 140 is operated.

The electrostatic capacitance detection unit 120 detects an electrostatic capacitance between a conductive member 320 (refer to FIG. 3) of a ground potential (GND potential) and a detection electrode group 130a. Similarly, the electrostatic capacitance detection unit 120 detects an electrostatic capacitance between the conductive member 320 of the GND potential and a detection electrode group 130b and an electrostatic capacitance between the conductive member 320 of the GND potential and a detection electrode group 130c. Hereinafter, the electrostatic capacitance between the conductive member 320 and the detection electrode group 130a is referred to as an electrostatic capacitance of the detection electrode group 130a, the electrostatic capacitance between the conductive member 320 and the detection electrode group 130b is referred to as an electrostatic capacitance of the detection electrode group 130b, and the electrostatic capacitance between the conductive member 320 and the detection electrode group 130c is referred to as an electrostatic capacitance of the detection electrode group 130c. The electrostatic capacitance of the detection electrode group 130a, the electrostatic capacitance of the detection electrode group 130b, and the electrostatic capacitance of the detection electrode group 130c detected by the electrostatic capacitance detection unit 120 are transmitted to the CPU 150. Although the electrostatic capacitance detection unit 120 is connected to the CPU 150 in FIG. 1, the electrostatic capacitance detection unit 120 may be incorporated in the CPU 150. Alternatively, the electrostatic capacitance detection unit 120 may be implemented in the CPU 150 by a program executed by the CPU 150. The CPU 150 detects an operation performed by the user on the operation unit 140 in accordance with the electrostatic capacitances of the detection electrode group 130a to 130c detected by the electrostatic capacitance detection unit 120. The detection electrode groups 130a to 130c are included in a detection electrode unit 130, for example. The detection electrode unit 130 is disposed on a circumference of a circle having an axis the same as that of the conductive member 320 having the GND potential such that the detection electrode unit 130 faces the conductive member 320.

The CPU 150 is capable of setting arbitrary reference values and arbitrary threshold values (or predetermined values) in the electrostatic capacitance detection unit 120. The arbitrary reference values include a reference value for the detection electrode group 130a, a reference value for the detection electrode group 130b, and a reference value for the detection electrode group 130c. The arbitrary threshold values (or predetermined values) include a threshold value (or a predetermined value) for the detection electrode group 130a, a threshold value (or a predetermined value) for the detection electrode group 130b, and a threshold value (or a predetermined value) for the detection electrode group 130c. The electrostatic capacitance detection unit 120 generates an interrupt to the CPU 150 when the electrostatic capacitance of the detection electrode group 130a is larger than the threshold value (or the predetermined value) which is larger than the reference value for the detection electrode group 130a. The electrostatic capacitance detection unit 120 generates an interrupt to the CPU 150 when the electrostatic capacitance of the detection electrode group 130b is larger than the threshold value (or the predetermined value) which is larger than the reference value for the detection electrode group 130b. The electrostatic capacitance detection unit 120 generates an interrupt to the CPU 150 when the electrostatic capacitance of the detection electrode group 130c is larger than the threshold value (or the predetermined value) which is larger than the reference value for the detection electrode group 130c. The CPU 150 may cause the electrostatic capacitance detection unit 120 to output the electrostatic capacitances of the detection electrode groups 130a to 130c to the CPU 150 at an arbitrary timing.

Figure 4A:
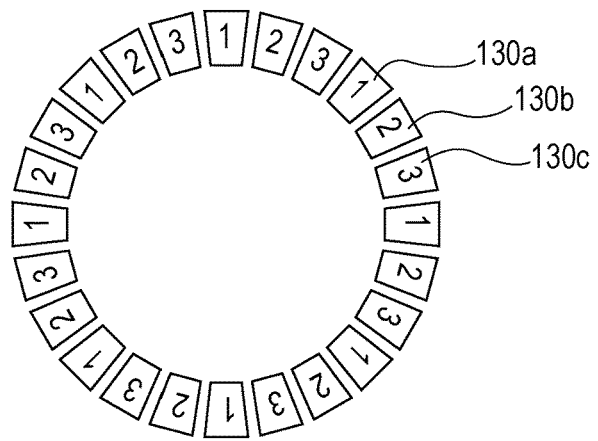
FIG. 4A is a diagram illustrating arrangement of detection electrodes included in a detection electrode unit 130 on a substrate.
Figure 4B:
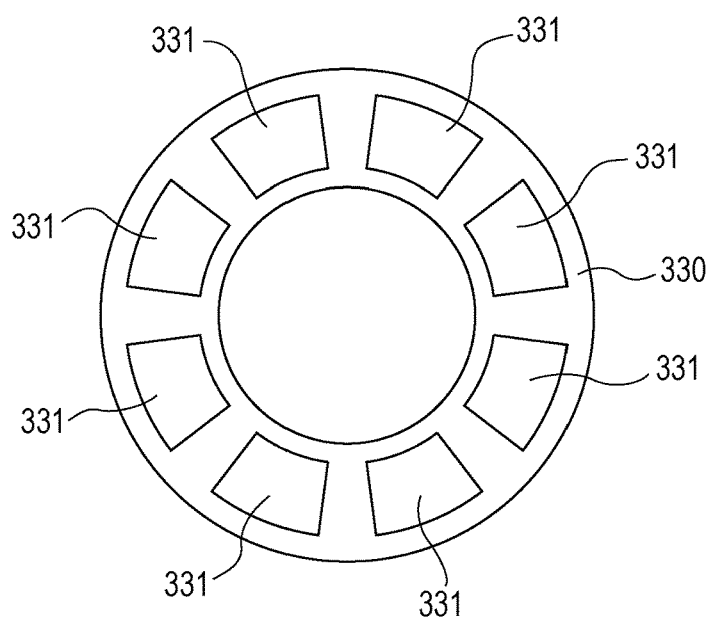
FIG. 4B is a plan view illustrating a shape of a rotating conductive plate 330.
Figure 4C:
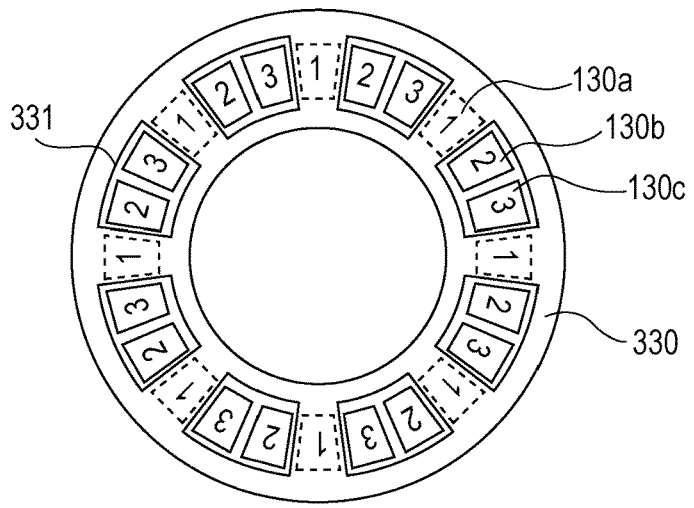
FIG. 4C is a plan view illustrating the arrangement relationship between the rotating conductive plate 330 and the detection electrode unit 130 which overlap with each other.

Each of detection electrodes included in the detection electrode unit 130 is included in one of the detection electrode groups 130a to 130c. The detection electrode groups 130a to 130c are alternately arranged on a circumference one-by-one as illustrated in FIGS. 4A to 4C. The electrostatic capacitance detection unit 120 detects a sum of electrostatic capacitances between the conductive member 320 having the GND potential and the detection electrodes included in the detection electrode group 130a, and transmits the detected sum to the CPU 150 as the electrostatic capacitance of the detection electrode group 130a. The electrostatic capacitance detection unit 120 detects a sum of electrostatic capacitances between the conductive member 320 having the GND potential and the detection electrodes included in the detection electrode group 130b, and transmits the detected sum to the CPU 150 as the electrostatic capacitance of the detection electrode group 130b. The electrostatic capacitance detection unit 120 detects a sum of electrostatic capacitances between the conductive member 320 having the GND potential and the detection electrodes included in the detection electrode group 130c, and transmits the detected sum to the CPU 150 as the electrostatic capacitance of the detection electrode group 130c.

The operation unit 140 is included in the electronic apparatus 100. As illustrated in FIG. 2B, the operation unit 140 is implemented on the electronic apparatus 100 as a rotating dial. However, the operation unit 140 is not limited to the rotating dial and may be a slider or other dials. The operation unit 140 is used for various operations performed by the user, such as an operation of changing a mode of the electronic apparatus 100, an operation of selecting a ranging point, an operation of selecting an image to be reproduced, and an operation performed on a menu.

Figure 3:
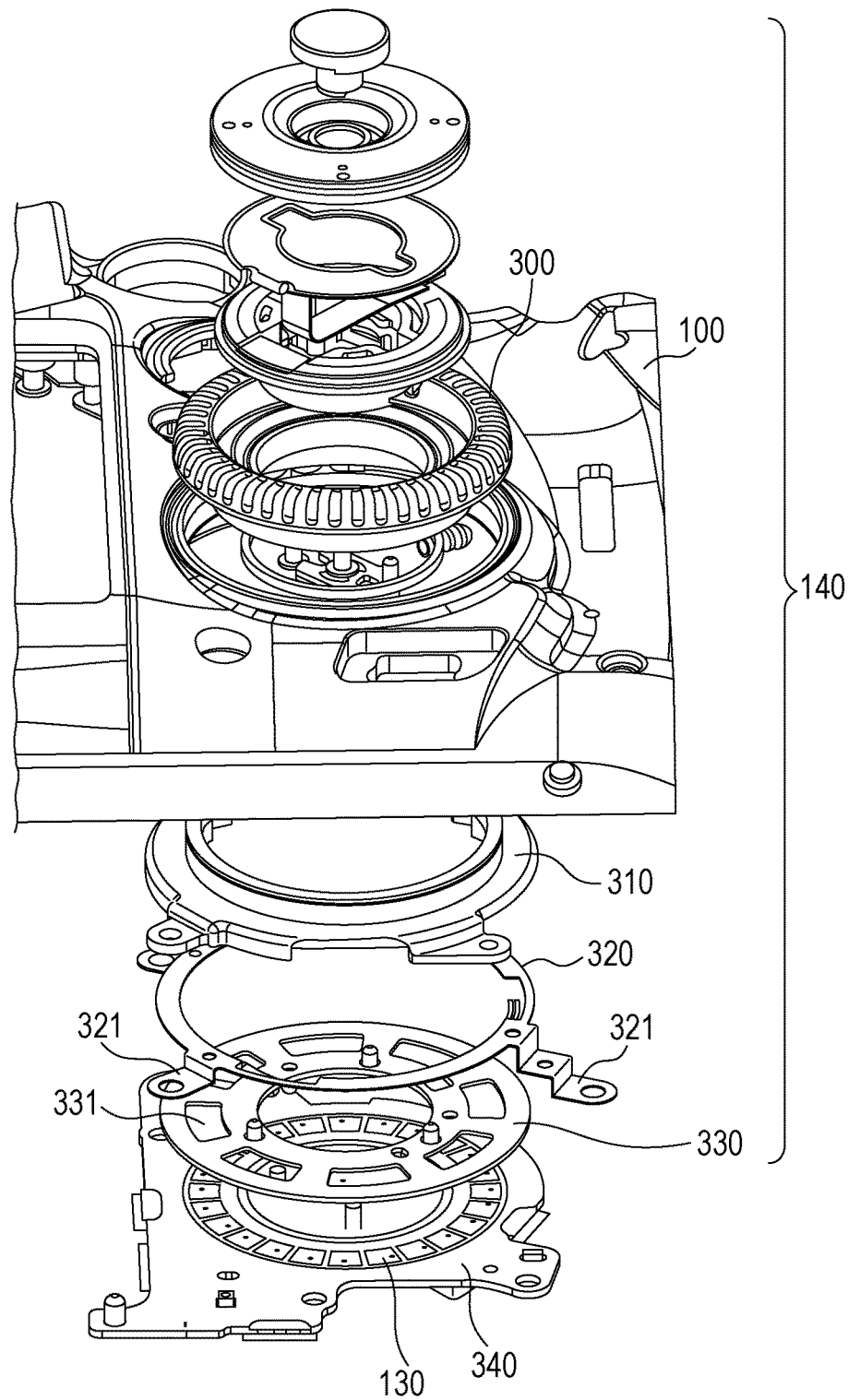
FIG. 3 is an exploded perspective view of an operation unit 140 implemented as a rotating dial.

Next, the positional relationship between the detection electrode unit 130 and the operation unit 140 will be described with reference to FIG. 3. FIG. 3 is an exploded perspective view of the operation unit 140 implemented as the rotating dial. The operation unit 140 at least includes a rotating member 300, a ring 310, the conductive member 320, and three contact portions 321, and a rotating conductive plate 330.

The rotating member 300 is an operation member that is operated by the user. The ring 310 is fixed on a case of the electronic apparatus 100 and has an uneven shape on an inner circumference thereof. A ball which is to be in contact with the uneven shape in the inner circumference of the ring 310 is disposed on the rotating member 300 in a state in which the ball is biased toward the inner circumference of the ring 310. When the user performs an operation of rotating the rotating member 300, the ball of the rotating member 300 moves while being in contact with the uneven shape in the inner circumference of the ring 310 and a resistance of the rotating operation is periodically changed. By this, the user has a feeling of clicking every operation at a certain angle.

The conductive member 320 is a metallic member having the GND potential. The conductive member 320 is fixed to a metal case portion of the electronic apparatus 100 by screws or the like, and has the potential electrically the same as the GND potential of the electrostatic capacitance detection unit 120. The three contact portions 321 extend from the conductive member 320 so as to cause the rotating conductive plate 330 to have the GND potential. In the first embodiment, the conductive member 320 is electrically and physically in contact with the rotating conductive plate 330 at three points by the three contact portions 321. However, the number of contact portions 321 and a configuration of the contact portions 321 are not limited to those illustrated in FIG. 3. The rotating conductive plate 330 rotates integrally with the rotating member 300, and is an example of a movable member which moves in a direction in which arrangement of the detection electrodes included in the detection electrode unit 130 in response to a user's operation.

The detection electrodes included in the detection electrode unit 130 are basically disposed on the inner circumference of a substrate 340 at a certain pitch.

Although the rotating conductive plate 330 is in contact with the conductive member 320 of the GND potential in FIG. 3, this configuration may be arbitrarily changed. For example, a GND pattern may be formed on the substrate 340 and the rotating conductive plate 330 may be in contact with the GND pattern, so that the GND pattern is used as the conductive member 320 of the GND potential. Furthermore, a rotating dielectric member having a shape the same as that of the rotating conductive plate 330 may be disposed instead of the rotating conductive plate 330, and the three contact portions 321 may be omitted.

An example of a shape of the rotating conductive plate 330 and an example of arrangement of the detection electrodes included in the detection electrode unit 130 will be described with reference to FIGS. 4A to 4C. FIG. 4A is a diagram illustrating arrangement of the detection electrodes included in the detection electrode unit 130 on the substrate 340. FIG. 4B is a plan view illustrating a shape of the rotating conductive plate 330. FIG. 4C is a plan view illustrating the arrangement relationship between the rotating conductive plate 330 and the detection electrode unit 130 which overlap with each other.

In FIG. 4A, a reference numeral 1 is assigned to detection electrodes included in the detection electrode group 130a, a reference numeral 2 is assigned to detection electrodes included in the detection electrode group 130b, and a reference numeral 3 is assigned to detection electrodes included in the detection electrode group 130c. The detection electrode groups 130a to 130c have the same number of detection electrodes. The detection electrodes included in the detection electrode group 130a are connected to one another by a line on the substrate 340, and are connected to a port of the electrostatic capacitance detection unit 120. The detection electrodes included in the detection electrode group 130b are also connected to one another by a line on the substrate 340, and are connected to a port of the electrostatic capacitance detection unit 120. The detection electrodes included in the detection electrode group 130c are also connected to one another by a line on the substrate 340, and are connected to a port of the electrostatic capacitance detection unit 120. In the arrangement example of FIG. 4A, the detection electrodes included in the detection electrode unit 130 are arranged on the substrate 340 at a substantially even angle in an inner circumference direction such that a group including one of the detection electrodes included in the detection electrode group 130a, one of the detection electrodes included in the detection electrode group 130b, and one of the detection electrodes included in the detection electrode group 130c in this order is repeatedly arranged. Although the detection electrode unit 130 has 24 detection electrodes in FIG. 4, this is merely an example. The total number of detection electrodes included in the detection electrode group 130a, the total number of detection electrodes included in the detection electrode group 130b, and the total number of detection electrodes included in the detection electrode group 130c are not limited to eight. For example, the total number of detection electrodes included in the detection electrode group 130a, the total number of detection electrodes included in the detection electrode group 130b, and the total number of detection electrodes included in the detection electrode group 130c may be at least two.

As illustrated in FIG. 4B, vacant slots 331 are formed on the rotating conductive plate 330 (eight vacant slots, for example, in FIGS. 3, 4B, and 4C). When the rotating conductive plate 330 and the detection electrode unit 130 overlap with each other, each of the vacant slots 331 simultaneously face adjacent two of the three different detection electrodes. In this case, each of spaces between the vacant slots 331 faces a remaining one of the three different detection electrodes. Accordingly, it is possible that, as illustrated in FIG. 4C, when each of the vacant slots 331 faces a detection electrode included in the detection electrode group 130b and a detection electrode included in the detection electrode group 130c adjacent to the detection electrode group 130b, each of the spaces between the vacant slots 331 faces a detection electrode included in the detection electrode group 130a. It is also possible that, when each of the vacant slots 331 faces a detection electrode included in the detection electrode group 130a and a detection electrode included in the detection electrode group 130b adjacent to the detection electrode group 130a, each of the spaces between the vacant slots 331 faces a detection electrode included in the detection electrode group 130c. Furthermore, it is also possible that, when each of the vacant slots 331 faces a detection electrode included in the detection electrode group 130a and a detection electrode included in the detection electrode group 130c adjacent to the detection electrode group 130a, each of the spaces between the vacant slots 331 faces a detection electrode included in the detection electrode group 130b. The rotating conductive plate 330 is engaged with the rotating member 300 so that the rotating conductive plate 330 is stable or stopped in the states described above.

Figure 5:
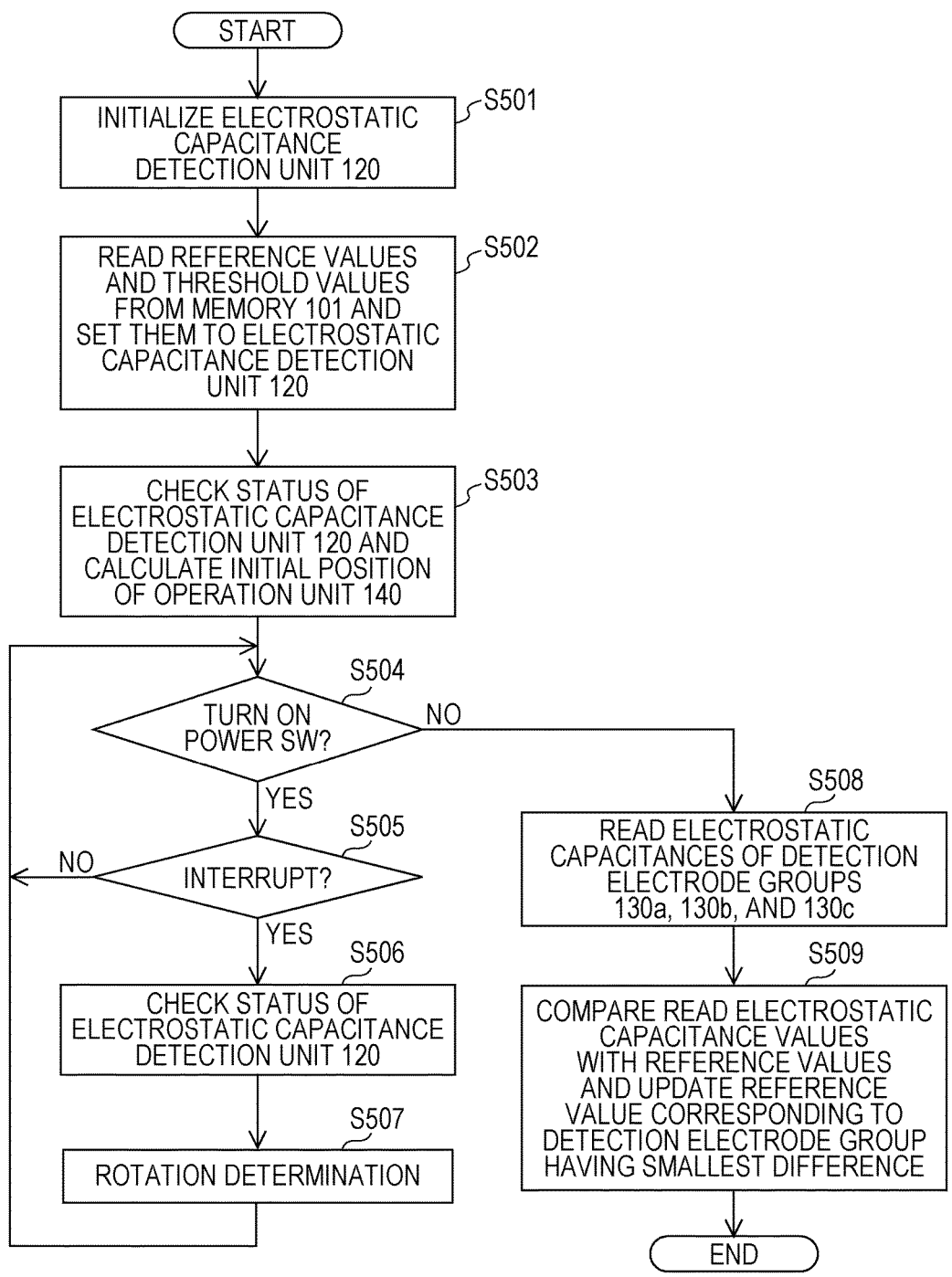
FIG. 5 is a flowchart illustrating an electrostatic capacitance detection process and a reference value updating process.

In the first embodiment, at least one of the reference values for the detection electrode groups 130a to 130c is updated when a battery is connected to the electronic apparatus 100 or when the battery connected to the electronic apparatus 100 is changed. Since a threshold value is determined by the CPU 150 in accordance with a reference value, a threshold value corresponding to the updated reference value is also updated by the CPU 150. FIG. 5 is a flowchart illustrating an electrostatic capacitance detection process which is a process of detecting electrostatic capacitances of the detection electrode groups 130a to 130c. FIG. 5 is also a flowchart illustrating a reference value updating process which is a process of updating at least one of the reference values of the detection electrode groups 130a to 130c. The electrostatic capacitance detection process and the reference value updating process illustrated in FIG. 5 may be executed by the CPU 150 at an arbitrary timing including a timing when the power is on. For example, a switch for detecting open/close of a battery cover may be provided, and the electrostatic capacitance detection process and the reference value updating process may be executed at a timing when the battery cover is closed which is detected by the switch. Furthermore, the electrostatic capacitance detection process and the reference value updating process illustrated in FIG. 5 may be executed at a timing when the electronic apparatus 100 is recovered from a sleep state by power management of the CPU 150.

In step S501, the CPU 150 performs an initial setting on the electrostatic capacitance detection unit 120. For example, the total number of detection electrodes included in the detection electrode group 130a, the total number of detection electrodes included in the detection electrode group 130b, and the total number of detection electrodes included in the detection electrode group 130c are set.

In step S502, the reference values for the detection electrode groups 130a to 130c and the threshold values for the detection electrode groups 130a to 130c are read by the CPU 150 from the first memory 101, and are set in the electrostatic capacitance detection unit 120. By this, the electrostatic capacitance detection unit 120 determines one of the electrostatic capacitances of the detection electrode groups 130a to 130c which is larger than the corresponding threshold value larger than the corresponding reference value.

In step S503, the CPU 150 checks a status of the electrostatic capacitance detection unit 120. The status of the electrostatic capacitance detection unit 120 includes information representing one of the electrostatic capacitances of the detection electrode groups 130a to 130c which is larger than the corresponding threshold value which is larger than the corresponding reference value. By this, the CPU 150 determines a rotation position (an initial phase) of the operation unit 140. The rotation position (the initial phase)

of the operation unit 140 represents selected one of the detection electrode groups 130*a* to 130*c*. Thereafter, the CPU 150 determines a rotation direction, a rotation amount, and a rotation angle of a rotating operation in accordance with changes of the electrostatic capacitances of the detection electrode groups 130*a* to 130*c* caused by the rotating operation using the determined position as a reference.

In step S504, the CPU 150 determines whether a state of the power SW 106 is changed to an on state or an off state. When it is determined that the state of the power SW 106 is changed to an on state, the CPU 150 proceeds to step S505 so as to detect a rotating operation of the rotating member 300 (Yes in step S504). When it is determined that the state of the power SW 106 is changed to an off state, the CPU 150 proceeds to step S508 so as to update at least one of the reference values for the detection electrode groups 130*a* to 130*c* (No in step S504). For facilitating the understanding, in the flowchart of FIG. 5, the determination as to whether the state of the power SW 106 is changed to an on state or an off state is performed in step S504. However, an interrupt to the CPU 150 may be generated in association with the change of the state of the power SW 106 to an on state or an off state.

In step S505, the CPU 150 determines whether an interrupt is generated by an output of the electrostatic capacitance detection unit 120. The electrostatic capacitance detection unit 120 periodically measures the electrostatic capacitances of the detection electrode groups 130*a* to 130*c*. The electrostatic capacitance detection unit 120 issues an interrupt to the CPU 150 when one of the electrostatic capacitances of the detection electrode groups 130*a* to 130*c* is larger than the corresponding threshold value which is larger than the corresponding reference value (Yes in step S505).

In step S506, the CPU 150 checks the status of the electrostatic capacitance detection unit 120 in response to the interrupt by the electrostatic capacitance detection unit 120. The status of the electrostatic capacitance detection unit 120 includes information representing one of the electrostatic capacitances of the detection electrode groups 130*a* to 130*c* which is larger than the corresponding threshold value which is larger than the corresponding reference value.

In step S507, the CPU 150 determines a rotation direction and a rotation amount of the rotating member 300 in accordance with the status checked in step S506. Furthermore, the CPU 150 may determine a rotation angle in accordance with the determined rotation direction and the determined rotation amount. The CPU 150 determines a mode designated by the user through an operation using the rotating member 300 in accordance with the determined rotation direction and the determined rotation amount, and updates display of the display unit 103.

In step S508, the CPU 150 reads the electrostatic capacitances of the detection electrode groups 130*a* to 130*c* through the electrostatic capacitance detection unit 120.

In step S509, the CPU 150 compares the electrostatic capacitance of the detection electrode group 130*a* read in step S508 with the reference value for the detection electrode group 130*a* so as to obtain a difference therebetween. The CPU 150 compares the electrostatic capacitance of the detection electrode group 130*b* read in step S508 with the reference value for the detection electrode group 130*b* so as to obtain a difference therebetween. The CPU 150 compares the electrostatic capacitance of the detection electrode group 130*c* read in step S508 with the reference value for the detection electrode group 130*c* so as to obtain a difference therebetween. Then the CPU 150 replaces one of the reference values of the detection electrode groups 130*a* to 130*c* which corresponds to the smallest one of the calculated differences and which is stored in the first memory 101 by the corresponding electrostatic capacitance read in step S508. It is assumed that a storage element of the first memory 101 which stores the reference value for the replacement is a nonvolatile memory (an EEPROM, for example). A portion of the second memory 102 may be used as a nonvolatile memory, and the updated reference value may be stored in the nonvolatile memory. By this, the CPU 150 may update at least one of the reference values for the detection electrode groups 130*a* to 130*c*. When at least one of the reference values for the detection electrode groups 130*a* to 130*c* is updated, the CPU 150 may update the threshold value corresponding to the updated reference value.

Although the reference value updating process (step S508 and step S509) is started when the power SW 106 enters an off state in the flowchart illustrated in FIG. 5, the reference value updating process (step S508 and step S509) may be started at a different predetermined timing. For example, the reference value updating process may be started when the sleep state is entered by the power management of the CPU 150 so that one of the reference values of the detection electrode groups 130*a* to 130*c* is updated.

FIG. 6 is a diagram illustrating changes of the electrostatic capacitances of the detection electrode groups 130*a* to 130*c* when the rotating member 300 is operated to rotate. As described above, the electrostatic capacitance detection unit 120 detects the electrostatic capacitances of the detection electrode groups 130*a* to 130*c*. In FIG. 6, (a) is a graph illustrating the change of the electrostatic capacitance of the detection electrode group 130*a*, (b) is a graph illustrating the change of the electrostatic capacitance of the detection electrode group 130*b*, and (c) is a graph illustrating the change of the electrostatic capacitance of the detection electrode group 130*c*. In (a) to (c) of FIG. 6, an axis of abscissa denotes time and an axis of ordinate denotes the electrostatic capacitances.

FIG. 7 is a diagram illustrating changes of the electrostatic capacitances of the detection electrode groups 130*a* to 130*c* in positions where the rotating member 300 is stopped. In FIG. 7, (a) is a graph illustrating the change of the electrostatic capacitance of the detection electrode group 130*a*, (b) is a graph illustrating the change of the electrostatic capacitance of the detection electrode group 130*b*, and (c) is a graph illustrating the change of the electrostatic capacitance of the detection electrode group 130*c*. In (a) to (c) of FIG. 7, an axis of abscissa denotes time and an axis of ordinate denotes the electrostatic capacitances. As illustrated by vertical dotted lines in FIG. 7, in each of rotation positions of the rotating member 300, at least one of the electrostatic capacitances of the detection electrode groups 130*a* to 130*c* has the smallest value. Since the threshold values are obtained by adding the predetermined values to the reference values in the first embodiment, for example, the threshold values may be appropriately determined by appropriately determining the reference values.

Furthermore, in each of stop positions of the rotating member 300 in which the ball of the rotating member 300 is engaged with recess portions in the inner circumference of the ring 310, one of the electrostatic capacitances of the detection electrode groups 130*a* to 130*c* is large and the other two of the electrostatic capacitances are small. In this state, the reference values of the two of the detection electrode groups 130*a* to 130*c* which have the small electrostatic capacitances may be determined, and accordingly, the threshold values of the two of the detection electrode groups 130a to 130c may be determined.

According to the reference value updating process illustrated in FIG. 5 (step S508 and step S509), the reference value of one of the detection electrode groups which has the smallest difference between the detected electrostatic value and the reference value is updated by the detected electrostatic capacitances in the first embodiment. By this, at least one of the reference values corresponding to the detection electrode groups 130a to 130c matches the smallest electrostatic capacitance. Therefore, the electrostatic capacitance detection unit 120 is not required to take a case where a measured electrostatic capacitance is smaller than a reference value into consideration. By the process described above, irrespective of temporal change of the electrostatic capacitances, even when the electrostatic capacitances vary since rattle of the components of the operation unit 140 is generated during one revolution of the rotating member 300, the rotation angle, the rotation direction, or the rotation amount may be appropriately detected.

The reference values of the detection electrode groups 130a to 130c initially stored in the first memory 101 may be calculated in a design stage or measured in shipping for each apparatus.

When the user releases the electronic apparatus 100, the operation unit 140 may not be operated. Accordingly, the reference value updating process (step S508 and step S509) may be activated when the user releases the electronic apparatus 100 in accordance with an output of the holding detection unit 104.

The reference value updating process (step S508 and step S509) may be activated at a predetermined interval using the timer 151. In this case, when an operation performed by the user on the operation unit 140 is detected, the timer 151 is reset. By this, update of a reference value performed while the user operates the operation unit 140 is prevented.

The reference value updating process (step S508 and step S509) may be executed when the temperature measurement unit 107 detects a change of a temperature by a predetermined degree or more. It is preferable that the update of a reference values is performed later when the user is operating the operation unit 140. This is because a detection of a rotation direction or a rotation amount may fail if a reference value is updated when the user is operating the operation unit 140.

The number of rotations (a movement amount) of the operation unit 140 may be counted by the counter 152 and the reference value updating process (step S508 and step S509) may be executed every time a predetermined rotation number (a predetermined amount) is reached. Also in this case, it is preferable that the update of a reference value is performed later when the user is operating the operation unit 140. This is because a detection of a rotation direction or a rotation amount may fail if the reference values are updated when the user is operating the operation unit 140.

A size of each of the vacant slots 331 in a circumference direction in the rotating conductive plate 330 may be reduced so that one detection electrode faces the conductive member 320. Since a size in a portion between the vacant slots 331 corresponds to a size for two detection electrodes, the electrostatic capacitance detection unit 120 may detect electrostatic capacitances of detection electrodes included in the same detection electrode group. Specifically, contrary to the example illustrated in FIG. 4, detection electrodes of one of the detection electrode groups face the conductive member 320 in a stop position of the rotating conductive plate 330, and detection electrodes of the other two of the detection electrode groups face the rotating conductive plate 330. Also with this configuration, the rotating operation of the rotating member 300 may be detected in accordance with the flowchart illustrated in FIG. 5.

According to the configuration described above, even when rattle or deformation of the operation unit 140 including the detection electrode unit 130 and the rotating conductive plate 330 is generated, the CPU 150 may appropriately detect the rotation direction and the rotation amount of the rotating operation, and in addition, may appropriately detect the rotation angle.

Second Embodiment

Although the case where the rotating member is used is described in the first embodiment, the rotating member may be replaced by a non-rotating member (an operation member which is straightly reciprocated, for example). In a case where a detection electrode adjacent to an arbitrary detection electrode in one movement direction and another detection electrode adjacent to the arbitrary detection electrode in the other movement direction are included in different detection electrode groups, an operation direction and a movement amount may be detected.

Figure 8A:
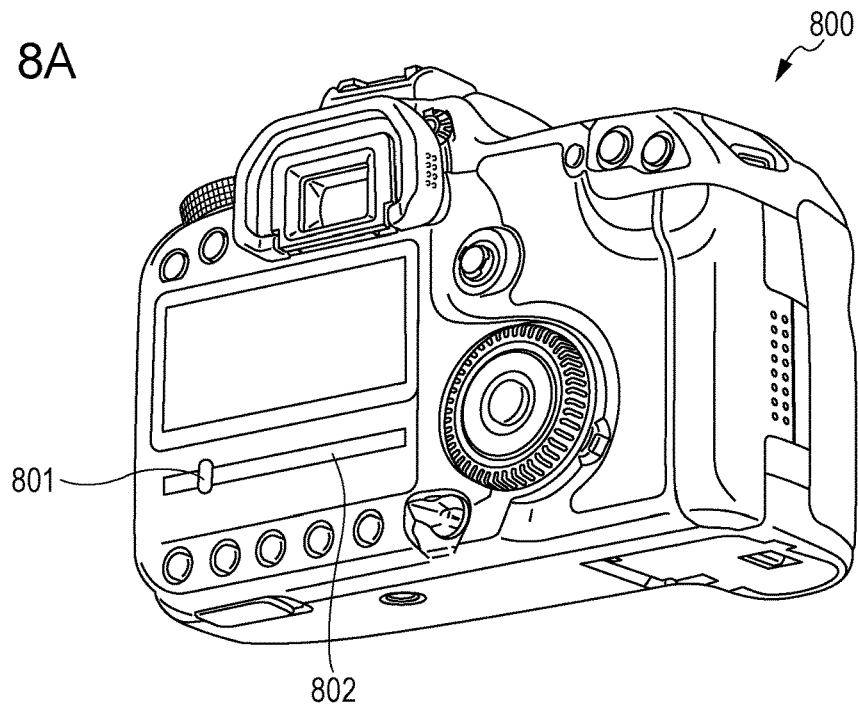
FIG. 8A is a back view illustrating appearance of an electronic apparatus 800 according to a second embodiment.
Figure 8B:
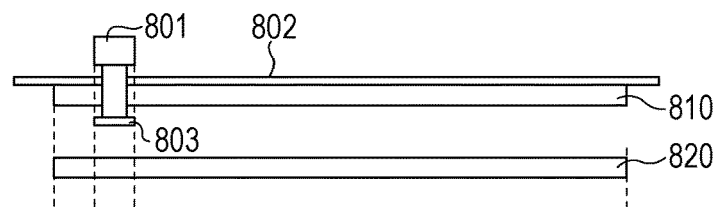
FIG. 8B is a diagram illustrating a configuration of a cross section of a non-rotating member 801.
Figure 8C:
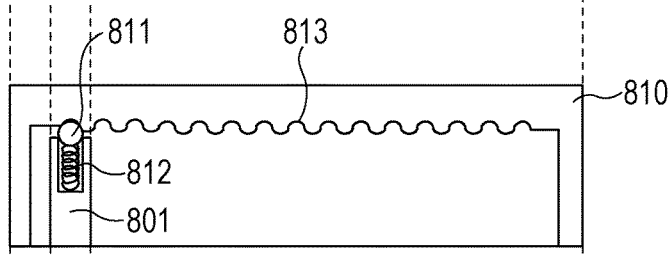
FIG. 8C is a plan view illustrating the non-rotating member 801.
Figure 8D:
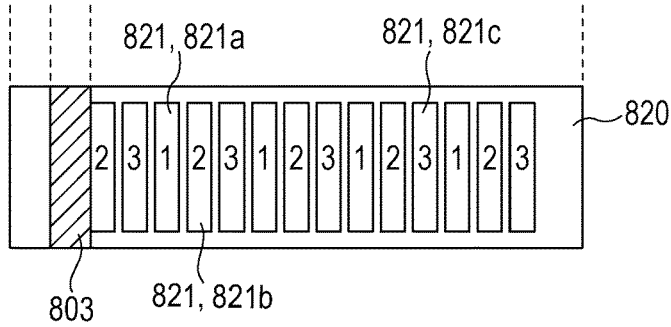
FIG. 8D is a plan view illustrating arrangement of detection electrodes.

In a second embodiment, an electronic apparatus 800 employing a non-rotating member 801 will be described. FIG. 8A is a back view of appearance of the electronic apparatus 800 according to the second embodiment, and FIG. 8B is a diagram illustrating a cross-sectional configuration of the non-rotating member 801. FIG. 8C is a plan view illustrating the non-rotating member 801, and FIG. 8D is a plan view illustrating arrangement of detection electrodes. Hereinafter, the non-rotating member is referred to as a "slider".

An internal configuration of the electronic apparatus 800 illustrated in FIG. 8B is different from the configuration illustrated in FIG. 1 in that the non-rotating member 801 is provided as the operation unit 140 and the detection electrode unit 130 is replaced by a detection electrode unit 821. Each of detection electrodes included in the detection electrode unit 821 is included in one of detection electrode groups 821a to 821c. The detection electrode groups 821a to 821c are alternately arranged on a straight line. An electrostatic capacitance detection unit 120 detects a sum of electrostatic capacitances between a conductive member 803 having a GND potential and detection electrodes included in the detection electrode group 821a, and transmits the detected sum to the CPU 150 as an electrostatic capacitance of the detection electrode group 821a. The electrostatic capacitance detection unit 120 detects a sum of electrostatic capacitances between the conductive member 803 having the GND potential and detection electrodes included in the detection electrode group 821b, and transmits the detected sum to the CPU 150 as an electrostatic capacitance of the detection electrode group 821b. The electrostatic capacitance detection unit 120 detects a sum of electrostatic capacitances between the conductive member 803 having the GND potential and detection electrodes included in the detection electrode group 821c, and transmits the detected sum to the CPU 150 as an electrostatic capacitance of the detection electrode group 821c.

The slider 801 is straightly movable along a rail 802. A metallic conductive member 803 of the GND potential adheres on a bottom surface of the slider 801, and moves along with a movement of the slider 801 over the detection electrodes included in the detection electrode unit 821 with a certain gap. By this movement, an electrostatic capacitance between the detection electrodes included in the detection electrode unit 821 and the metallic conductive member 803 changes in accordance with the movement of the slider 801. A size and a shape of the metallic conductive member 803 are determined such that the metallic conductive member 803 faces a single detection electrode.

A locking mechanism 810 which locks the slider 801 in a certain position in a certain cycle is disposed on a lower surface of the rail 802. The locking mechanism 810 includes a ball 811, a spring 812, and cyclic uneven surface 813. The cyclic uneven surface 813, which causes the ball 811 to be projected by the spring 812 and then to be engaged therewith in a lateral direction relative to the slider 801, is formed in parallel to a direction in which the slider 801 is moved. When a difference between heights of projections and recesses of the cyclic projection surface 813 is reduced, a weak feeling of clicking is attained whereas when the difference of the heights is increased, a strong feeling of clicking is attained.

The detection electrodes included in the detection electrode unit 821 are arranged on a substrate 820 at a predetermined interval along a sliding direction of the slider 801. The substrate 820 is disposed beneath the metallic conductive member 803 of the slider 801 with a predetermined gap. In any of positions of the slider 801, the metallic conductive member 803 is not in contact with any one of the detection electrodes included in the detection electrode unit 821. The detection electrodes included in the detection electrode unit 821 are straightly arranged along the sliding direction of the slider 801 in order of the detection electrode group 821a, the detection electrode group 821b, and the detection electrode group 821c.

A detection of the electrostatic capacitances of the detection electrode groups 821a to 821c and a reference value updating process are the same as those of the first embodiment, and therefore, detailed descriptions thereof are omitted.

Although the present invention is applied to an electronic apparatus such as an image capture apparatus in the first and second embodiments, the present invention is applicable to an electronic apparatus other than the image capture apparatus as long as the electronic apparatus includes an operation member capable of detecting a rotation direction or an operation direction and a rotation amount or an operation amount by an electrostatic capacitance.

The exemplary embodiments of the present invention have been described hereinabove. However, the present invention is not limited to the exemplary embodiments described above, and various modifications and alterations may be made within the scope of the invention.

Third Embodiment

At least one of the various functions, processes, and methods described in the first and second embodiments can be achieved using a program. Hereinafter, in a third embodiment, a program for realizing at least one of the various functions, processes, and methods described in the first and second embodiments will be referred to as a "program X". Furthermore, in the third embodiment, a computer for executing the program X will be referred to as a "computer Y". Examples of the computer Y include a personal computer, a microcomputer, and a central processing unit (CPU).

At least one of the various functions, processes, and methods described in the first and second embodiments can be realized by the computer Y executing the program X. In this case, the program X is supplied to the computer Y via a computer readable storage medium. A computer readable storage medium according to the third embodiment includes at least one of a hard disk device, a magnetic storage device, an optical storage device, a magneto-optical storage device, a memory card, a read only memory (ROM), and a random access memory (RAM). Furthermore, the computer readable storage medium according to the third embodiment is a non-transitory storage medium.

While the present invention is described with reference to exemplary embodiments, it is to be understood that the present invention is not limited to the exemplary embodiments. The scope of the following claims is to be accorded the broadest interpretation so as to encompass all modifications and equivalent structures.

This application claims priority from Japanese Patent Application No. 2014-186902, filed Sep. 12, 2014, which is hereby incorporated by reference herein in its entirety.

What is claimed is:

1. An electronic apparatus comprising:
   a first detection electrode group;
   a second detection electrode group including electrodes which are arranged adjacent to electrodes included in the first detection electrode group;
   a third detection electrode group including electrodes which are arranged adjacent to the electrodes included in the second detection electrode group;
   a rotating member configured to move among positions in which the rotating member faces the first to third detection electrode groups;
   a detection unit that detects electrostatic capacitances of the first to third detection electrode groups;
   a determination unit that determines a rotation direction, a rotation amount, or a rotation angle of the rotating member, using the electrostatic capacitances of the first to third detection electrode groups and threshold values for the first to third detection electrode groups;
   a selecting unit that obtains a first difference representing a difference between a first reference value and the electrostatic capacitance of the first detection electrode group, a second difference representing a difference between a second reference value and the electrostatic capacitance of the second detection electrode group, and a third difference representing a difference between a third reference value and the electrostatic capacitance of the third detection electrode group, and selects a smallest difference from the first to third differences; and
   an updating unit that updates one of the first to third reference values which corresponds to the selected smallest difference with one of the electrostatic capacitances of the first to third detection electrode groups which corresponds to the selected smallest difference, and updates one of the threshold values with the updated one of the first to third reference values.

2. The electronic apparatus according to claim 1, wherein the updating unit updates the one of the first to third reference values with the one of the electrostatic capacitances of the first to third detection electrode groups, in a case where a power switch is turned off.

3. The electronic apparatus according to claim 1, wherein the updating unit updates the one of the first to third reference values with the one of the electrostatic capacitances of the first to third detection electrode groups, in a case where a predetermined state is entered.

4. The electronic apparatus according to claim 1, wherein the electronic apparatus includes an image capture apparatus.

5. The electronic apparatus according to claim 1, wherein the electronic apparatus includes a digital camera or a mobile phone.

6. A method comprising:
   detecting electrostatic capacitances of first to third detection electrode groups;
   determining a rotation direction, a rotation amount, or a rotation angle of a rotating member, using the electrostatic capacitances of the first to third detection electrode groups and threshold values for the first to third detection electrode groups;
   obtaining a first difference representing a difference between a first reference value and the electrostatic capacitance of the first detection electrode group, a second difference representing a difference between a second reference value and the electrostatic capacitance of the second detection electrode group, and a third difference representing a difference between a third reference value and the electrostatic capacitance of the third detection electrode group;
   selecting a smallest difference from the first to third differences;
   updating one of the first to third reference values which corresponds to the selected smallest difference with one of the electrostatic capacitances of the first to third detection electrode groups which corresponds to the selected smallest difference; and
   updating one of the threshold values with the updated one of the first to third reference values,
   wherein the second detection electrode group includes electrodes which are arranged adjacent to electrodes included in the first detection electrode group,
   wherein the third detection electrode group includes electrodes which are arranged adjacent to the electrodes included in the second detection electrode group, and
   wherein the rotating member is configured to move among positions in which the rotating member faces the first to third detection electrode groups.

7. The method according to claim 6, wherein the one of the first to third reference values is updated with the one of the electrostatic capacitances of the first to third detection electrode groups, in a case where a power switch is turned off.

8. The method according to claim 6, wherein the one of the first to third reference values is updated with the one of the electrostatic capacitances of the first to third detection electrode groups, in a case where a predetermined state is entered.

9. The method according to claim 6, wherein an electronic apparatus including the first to third detection electrode groups includes an image capture apparatus.

10. The method according to claim 6, wherein an electronic apparatus including the first to third detection electrode groups includes a digital camera or a mobile phone.

11. A non-transitory storage medium that stores a program causing a computer to execute a method, the method comprising:
    detecting electrostatic capacitances of first to third detection electrode groups;
    determining a rotation direction, a rotation amount, or a rotation angle of a rotating member, using the electrostatic capacitances of the first to third detection electrode groups and threshold values for the first to third detection electrode groups;
    obtaining a first difference representing a difference between a first reference value and the electrostatic capacitance of the first detection electrode group, a second difference representing a difference between a second reference value and the electrostatic capacitance of the second detection electrode group, and a third difference representing a difference between a third reference value and the electrostatic capacitance of the third detection electrode group;
    selecting a smallest difference from the first to third differences;
    updating one of the first to third reference values which corresponds to the selected smallest difference with one of the electrostatic capacitances of the first to third detection electrode groups which corresponds to the selected smallest difference; and
    updating one of the threshold values with the updated one of the first to third reference values,
    wherein the second detection electrode group includes electrodes which are arranged adjacent to electrodes included in the first detection electrode group,
    wherein the third detection electrode group includes electrodes which are arranged adjacent to the electrodes included in the second detection electrode group, and
    wherein the rotating member is configured to move among positions in which the rotating member faces the first to third detection electrode groups.

* * * * *